United States Patent [19]

Lim et al.

[11] Patent Number: 5,318,922
[45] Date of Patent: Jun. 7, 1994

[54] METHOD FOR MANUFACTURING A SEMICONDUCTOR DEVICE

[75] Inventors: Byung-hak Lim, Kyungki-do; Yang-goo Lee, Seoul; Seon-jun Kim; Dong-gun Park, both of Kyungki-do, all, Rep. of Korea

[73] Assignee: Samsung Electronics Co., Ltd., Kyungki-do, Rep. of Korea

[21] Appl. No.: 15,184

[22] Filed: Feb. 11, 1993

[30] Foreign Application Priority Data

Feb. 12, 1992 [KR] Rep. of Korea ................... 92-2057

[51] Int. Cl.⁵ ............................................. H01L 21/76
[52] U.S. Cl. ........................................ 437/70; 437/61; 437/69; 437/72; 437/73
[58] Field of Search ................ 437/69, 70, 61, 72, 437/73

[56] References Cited

U.S. PATENT DOCUMENTS 4,897,364 1/1990 Nguyen et al. ..................... 437/69
4,927,780 5/1990 Roth et al. ........................ 437/69
5,175,123 12/1992 Vasquez et al. ................... 437/70

FOREIGN PATENT DOCUMENTS 0081041 4/1987 Japan ................................. 437/70
0229838 9/1988 Japan ................................. 437/70
0012528 1/1992 Japan ................................. 437/70
2129213 4/1984 United Kingdom ............... 437/70

Primary Examiner—Brian E. Hearn
Assistant Examiner—Trung Dang
Attorney, Agent, or Firm—Robert A. Westerlund; Charles R. Donohoe; Stephen R. Whitt

[57] ABSTRACT

A device isolation method for use in a process for manufacturing a semiconductor device, in which a pad oxide layer and a nitride layer are sequentially formed on the surface of a semiconductor substrate, an opening for defining the device isolating region is formed, and the substrate is oxidized at a high temperature to form a field oxide layer. Before the field oxide layer is formed, the nitride layer and pad oxide layer are etched to form a nitride layer spacer on the sidewalls of the pad oxide layer, to suppress the creation of a bird's beak due to lateral diffusion of oxygen between the pad oxide layer and nitride layer. In one embodiment, the nitride layer spacer is formed while leaving part of the pad oxide layer on the substrate, and the lower periphery of the spacer is undercut to be filled with an oxidizable material, thereby minimizing lateral diffusion of oxygen during the oxidation step.

8 Claims, 5 Drawing Sheets

METHOD FOR MANUFACTURING A SEMICONDUCTOR DEVICE

BACKGROUND OF THE INVENTION

The present invention relates generally to a method for manufacturing a semiconductor device, and more particularly, to a device isolating method which facilitates fabrication of a high-density semiconductor device by minimizing the lateral expansion of a field oxide layer in a process of forming the field oxide layer to accomplish the electrical isolation between nearby devices.

Generally, in manufacturing a semiconductor device, thousands of individual transistor devices are formed on a single silicon substrate. These devices are interconnected by internal wiring to provide an integrated circuit or IC. Since all the transistors are formed on the same substrate, they should be electrically isolated while allowing for the interconnections of the internal wires. Otherwise, undesired electrical connections between the transistors occur, resulting in circuit shorts. Several methods for device isolation have been heretofore proposed, including local oxidation of silicon (LOCOS).

Recently, semiconductor device integration density has been rapidly increased owing to the development of high resolution semiconductor processing techniques. In order to achieve such increased integration densities, the dimensions of the circuit pattern of the semiconductor device have been reduced, thereby necessitating that the device isolating region, also be proportionally reduced. Therefore, the technique employed for device isolation is an important factor with respect to increasing integration density of a semiconductor device, because it initially determines the dimension of a region in which a device is formed. In large-capacity memory devices, the device isolating process is a major factor with respect to determining the minimum dimension of a memory cell.

One of the most well-known device isolating techniques is a LOCOS technique in which a thick field oxide layer is selectively grown on a semiconductor substrate to be used as the device isolating region. In the LOCOS technique, a pad oxide layer, a nitride layer, and other layers are formed on a semiconductor substrate, and then patterned to thereby expose part of the semiconductor substrate. The exposed part of the substrate is oxidized, using the remaining layers as a mask, to form a thick field oxide layer. The thick field oxide layer is the device isolating region, and is commonly referred to as a field region. A typical conventional field oxide layer formation technique using the LOCOS method will be described below referring to FIGS. 1, 2 and 3.

Referring to FIG. 1, a pad oxide layer 12 and a silicon nitride layer 14 are sequentially formed on the overall surface of a silicon substrate 10, and a photoresist pattern 16 is formed on the resultant structure by a conventional photolithographic process. The photoresist pattern 16 defines the window for forming a field oxide layer. Subsequently, the exposed portion of the nitride layer 14 is dry-etched, using the photoresist pattern 16 as a mask, to form an opening 9, through which impurity ions of the same conductivity type as that of silicon substrate 10 are implanted to form a channel-stop layer 18 for preventing field inversion. For instance, if semiconductor substrate 10 is doped with P-type impurities, boron ions (B+) or another trivalent ion can be used for the impurity ion.

With reference now to FIG. 2, after the photoresist pattern 16 is removed, the silicon substrate 10 is exposed in a wet-oxidation atmosphere, under a high temperature of about 900° C. -1,100° C., so as to form a SiO2 field oxide layer 19. Since the silicon nitride layer 14 functions as an oxidation resistant layer for protecting the substrate during the oxidation step, field oxide layer 19 is formed only in the region in which its surface is exposed via opening 9. The oxidation step is carried out by combining an oxidizing agent and silicon. During the oxidation process, the silicon of the substrate is consumed, and the field oxide layer is formed, while the surface of the original substrate is corroded. However, the oxidation reaction does not solely occur in the vertical direction. Since the oxidizing agent (oxygen) infiltrates the flanks of the pad oxide layer under the nitride layer to be combined with the silicon of the substrate surface, the oxide layer is also grown horizontally and corrodes the active region in which a transistor, resistor, and the like, are formed. This lateral growth of the field oxide layer, commonly referred to as bird's beak, results in a reduction of the active region (i.e., the device forming region), thereby unduly limiting the integration density of the semiconductor device. Particularly, in a ULSI memory device requiring an active region size below 0.8 µm, due to the exceedingly elongated bird's beak, the conventional LOCOS method is no longer useful.

With reference now to FIG. 3, the silicon nitride layer 14 and the pad oxide layer 12 are sequentially removed to leave the field oxide layer 19 for device isolation. As discussed above, by comparing FIGS. 1 and 3, it should be noted that the size of the potential active region before the oxidation step for forming the field oxide layer 19 (see FIG. is significantly reduced after the oxidation step (see FIG. 3).

Because of the above-stated shortcomings, the conventional LOCOS method cannot be employed for manufacturing high-integration density semiconductor devices. In order to decrease the encroachment of the field oxide layer into the active region (in other words, in order to reduce the extension of the bird's beak), selective polysilicon oxidation (SEPOX) and polysilicon buffered LOCOS (PB-LOCOS) methods, which oxidize polysilicon during the formation of the field oxide layer so as to alleviate the extent of the encroachment, have been proposed. For example, in the method proposed by Hei in Japanese Patent laid-open publication No. 2-97038, a polysilicon layer on the silicon substrate and the silicon substrate are selectively oxidized to form field oxide layer.

In the PB-LOCOS method (sometimes called poly-buffered LOCOS or PBL), a polysilicon buffer layer is formed between the pad oxide layer and nitride layer of the conventional LOCOS method. Since the chief factor for bird's beak formation is the diffusion of oxygen into the silicon substrate through the pad oxide layer, the addition of the polysilicon buffer layer reduces the diffusion of oxygen through the pad oxide layer to thereby diminish the lateral corrosion of the active region.

In the SEPOX method, a polysilicon layer is interposed between the pad oxide layer and the nitride layer, and then the polysilicon layer is oxidized to form the field oxide layer. FIGS. 4, 5 and 6 are cross-sectional views for illustrating the conventional SEPOX method, which is explained below.

With reference now to FIG. 4, pad oxide layer 22, polysilicon layer 24 and nitride layer 26 are sequentially formed on silicon substrate 20, and nitride layer 26 is dry-etched to form opening 27 for the formation of the field region. Subsequently, impurity ions of the same conductivity type as that of the substrate are implanted through opening 27 to form channel-stop layer 28.

With reference now to FIG. 5, the exposed portion of the polysilicon layer 24 is oxidized by a wet oxidation process carried out at a high temperature, to thereby form field oxide layer 29.

With reference now to FIG. 6, nitride layer 26 and pad oxide layer 22 are removed to complete field oxide layer 29 to be used as the device isolating region.

Though the above-described PB-LOCOS and SEPOX techniques can greatly reduce the size of the bird's beak (a three-dimensional oxidation phenomenon) compared with the conventional LOCOS method, since the lateral corrosion problem still remains, problems with their implementation persist for high-density semiconductor devices. With these techniques, since the polysilicon layer is formed on the silicon substrate and is oxidized to form the field oxide layer, step coverage is decreased. Further, as in the conventional LOCOS method, since a wide channel-stop layer is formed after being self-aligned with the device active region, the breakdown voltage of the device is decreased, which precludes the channel-stop layer impurities from being implanted in high concentration, which results in a punch-through problem.

Meanwhile, the resolution of currently-used photolithography devices is another limitation in reducing the device isolating region. Such a limitation is a very serious problem in the manufacturing of a submicron-level semiconductor device. When the design goal is to reduce the device isolating region below 0.5 μm, since the minimum value of the resolution of the photolithography device is greater than a 0.5μ, it is impossible to achieve this design goal.

In order to overcome the limitations of photolithography technology, the side wall-masked isolation (SWAMI) technique has been proposed, wherein a spacer is added onto the sidewalls of the patterned nitride layer or buffer layer. Japanese patent laid-open publication No. 1-282839 (to Hei), and U.S. Pat. No. 4,897,364 disclose improvements of this technique. With Hei's technique, a polysilicon layer is used as a spacer. With the technique proposed in U.S. Pat. No. 4,897,364, a double polysilicon layer is used for controllable and uniform sidewall framing. Since such a spacer is formed by anistropic etching without using a patterned mask, the device isolating region can be reduced below the resolution limit of the photolithography equipment.

In addition, a polysilicon encapsulated local oxidation (PELOX) method has been proposed to effectively control the length of the bird's beak (see "Polysilicon Encapsulated Local Oxidation" by S.S. Roth et al., IEEE ELECTRON DEVICE LETTERS, vol. 12, No. 3, March 1991). In the PELOX method, a cavity formed along the periphery of the nitride layer is filled with polysilicon to control the length of the bird's beak during oxidation. However, though the PELOX method can effectively control bird's beak length, it is not so effective in reducing the overall length of the field oxide layer which is the device isolating region.

SUMMARY OF THE INVENTION

Based upon the above and forgoing, it can be appreciated that there presently exists a need in the art for a device isolation process which overcomes the above-described shortcomings and disadvantages of the presently available techniques. The present invention fulfills this need.

To accomplish the objects of the present invention, a first oxidation resistant layer only on the portion to become the device isolating region, or including part of a buffer layer, is etched on the semiconductor substrate in which the buffer layer and first oxidation resistant layer are stacked, and a spacer of a second oxidation resistant layer is formed on the etched sidewalls. The buffer layer is undercut to form a cavity along the lower periphery of the spacer, an oxidizable material is deposited on the overall surface of the resultant structure, and the substrate is oxidized.

Further, the buffer and first oxidation resistant layer on the portion to become the device isolating region are etched on the semiconductor substrate in which the buffer layer and first oxidation resistant layer are stacked, until the substrate is exposed. The spacer of the second oxidation resistant layer is formed on the etched sidewalls and the substrate is oxidized.

In the first embodiment of the present invention, there is provided a manufacturing method for a semiconductor device comprising the steps of: sequentially forming a buffer layer and a first oxidation resistant layer on a semiconductor substrate; selectively removing the first oxidation resistant layer to form a masking portion made of the first oxidation resistant layer only on the device active region; forming a spacer with oxidation resistant material along the sidewalls of the masking portion; removing the exposed portion of the buffer layer and the portion thereof under the spacer so as to form a cavity along the lower periphery of the spacer; depositing an oxidizable material on the resultant structure to fill the cavity and form an oxide material layer; and oxidizing the oxide material layer and the portion of the substrate defined by the masking portion so as to form a field oxide layer on the device isolating region.

In the second embodiment of the present invention, there is provided a manufacturing method for a semiconductor device comprising the steps of: sequentially forming a buffer layer and a first oxidation resistant layer on a semiconductor substrate; selectively removing the buffer layer and first oxidation resistant layer to expose the semiconductor substrate and forming a masking portion made of the first oxidation resistant layer only on the device active region; forming a spacer with oxidation resistant material along the sidewalls of the masking portion; depositing an oxidizable material on the resultant structure to form an oxide material layer; and oxidizing the oxide material layer and the portion of the substrate defined by the masking portion so as to form a field oxide layer on the device isolating region.

In the present invention, since the spacer of the second oxidation resistant layer prevents an oxidizing agent from infiltrating into the flanks of the pad oxide layer during the oxidation step, the bird's beak can be minimized. Further, the bottom of the spacer is preferably undercut and filled with oxidizable material, to thereby further minimize the bird's beak, Further, since the spacer is used to mask against the implantation of the channel-stop ions, the ion implantation width is greatly narrowed to thereby remarkably shorten the lateral diffusion distance of the channel-stop ions during a subsequent annealing process.

BRIEF DESCRIPTION OF THE DRAWINGS

These and various other features and advantages of the present invention will be readily understood with reference to the following detailed description thereof taken in conjunction with the accompanying drawings, wherein like reference numericals designate like structural elements, and, in which.

DETAILED DESCRIPTION OF THE INVENTION

Figure 1:
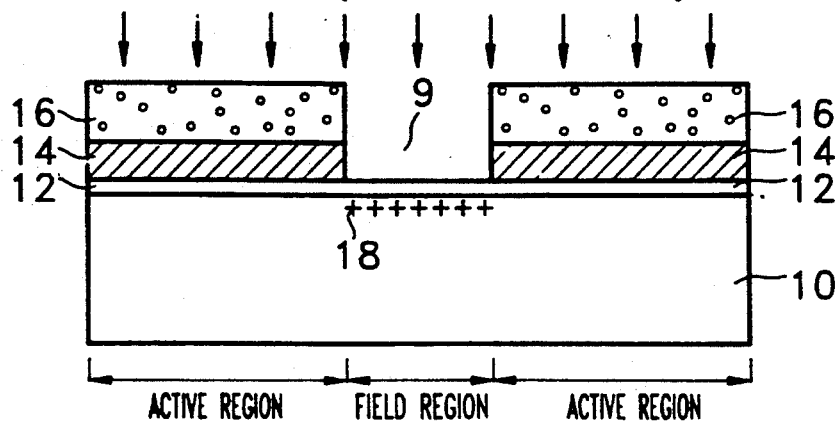
Figure 2:
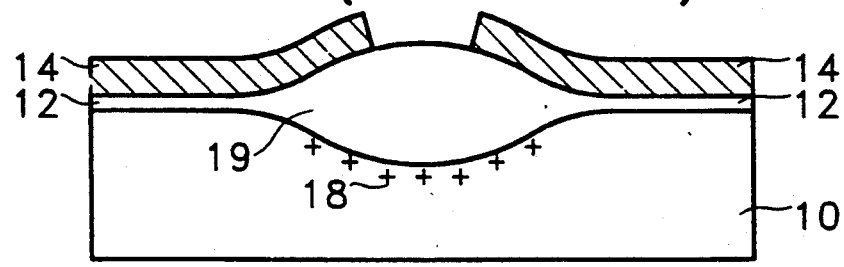
FIGS. 2 and 3 are cross-sectional views illustrating device isolation region formation using a conventional LOCOS method.
Figure 3:
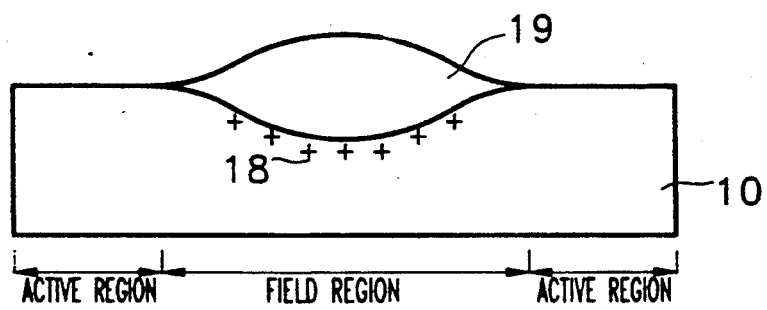
Figure 4:
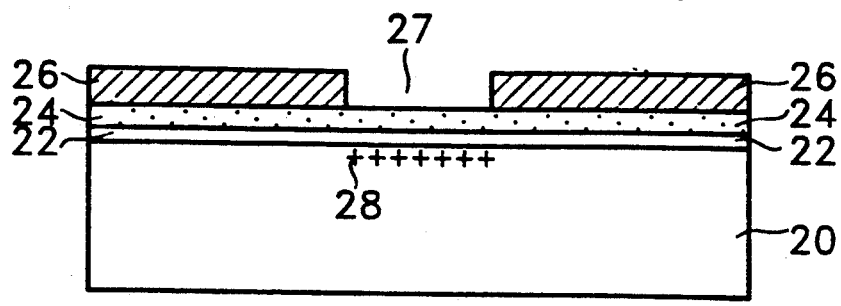
FIGS. 4, 5 and 6 are cross-sectional views illustrating device isolation region formation using a conventional SEPOX method.
Figure 5:
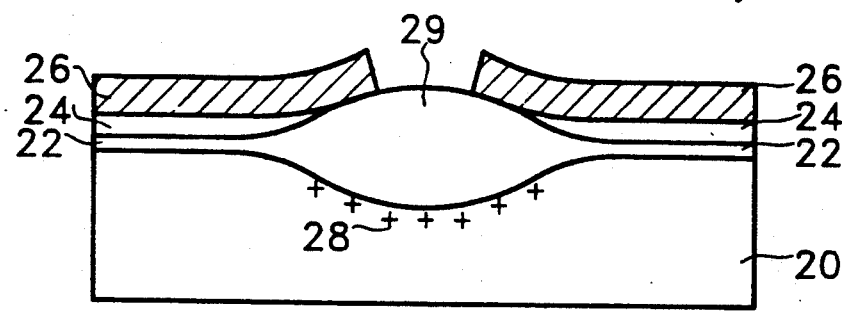
Figure 6:
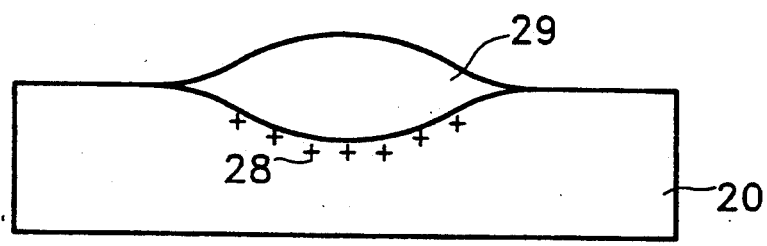
Figure 7:
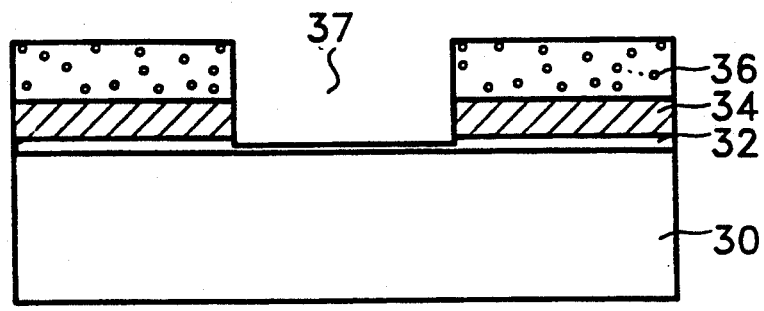
FIGS. 7-12 are cross-sectional views illustrating one embodiment of the device isolation region formation process according to the present invention; and, FIGS. 13, 14 and 15 are cross-sectional views illustrating another embodiment of the device isolation region formation process according to the present invention.

With reference now to FIG. 7, there can be seen an illustration of the first step of the method of the present invention, namely, the step of forming an opening for defining the device isolating region on a silicon substrate, wherein a masking portion 34 made of a first oxidation resistant layer is left only over the portions of the substrate which will serve as device active regions. More particularly, a pad oxide layer 32, which will serve as a buffer layer, is formed on silicon substrate 30, and the first oxidation resistant layer 34 is formed on the surface of pad oxide layer 32. The first oxidation resistant layer 34 is made of a material which is resistant to oxidation during the subsequent formation of the field oxide layer. For example, the first oxidation resistant layer 34 can be made of silicon nitride or oxynitride, and is preferably formed as thinly as possible, e.g., about 1,000-2000 Å thick, to prevent the lateral diffusion of oxygen during oxidation. The buffer layer 32 may be a composite layer in which a thin polysilicon layer (not shown) is interlaid between the pad oxide layer 32 and the first oxidation resistant layer 34.

Subsequently, a photoresist layer 36 is coated on the surface of the first oxidation resistant layer 34 and then patterned to form a photoresist layer pattern 36. Using photoresist layer pattern 36 as a mask, the first oxidation resistant layer 34 is etched to form an opening 37 between the device active regions. The first oxidation resistant layer 34 (hereinafter referred to as masking portion 34) is left on the portions which become the device active regions, so as to prevent the oxidation of silicon substrate 30 during a subsequent oxidation step. It is irrelevant that part of the top surface of pad oxide layer 32 exposed by opening 37 is slightly etched.

Figure 8:
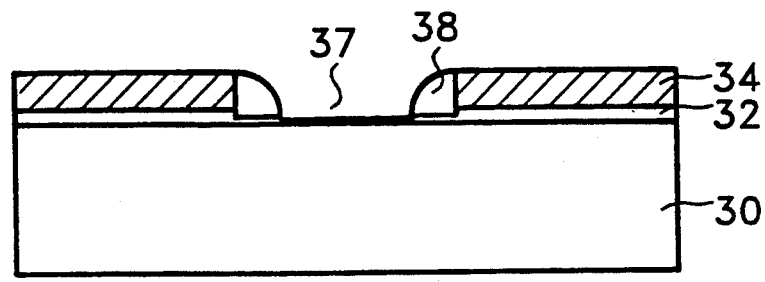

With reference now to FIG. 8, spacers are formed on the sidewalls of the masking portion 34. More particularly, a second oxidation resistant layer (not shown), also made of, for example, the same material as the first oxidation resistant layer 34, is formed on the overall surface of the resultant structure after the photoresist layer pattern 36 is removed. The second oxidation resistant layer is anisotropically etched to form spacers 38 on the sidewalls of masking portion 34. The lateral length of the spacers 38 is determined by the thickness of the second oxidation resistant nitride layer. The implanted range of the channel-stop ions is varied by the lateral length of spacer 38, which accordingly enables the control of their lateral diffusion. As such, the second oxidation resistant layer is coated to a thickness in which the lateral length of the channel-stop layer is the same as or shorter than that of the device isolating region. In the present invention, the second oxidation resistant layer is preferably formed to a thickness of about 2,500 Å.

Figure 9:
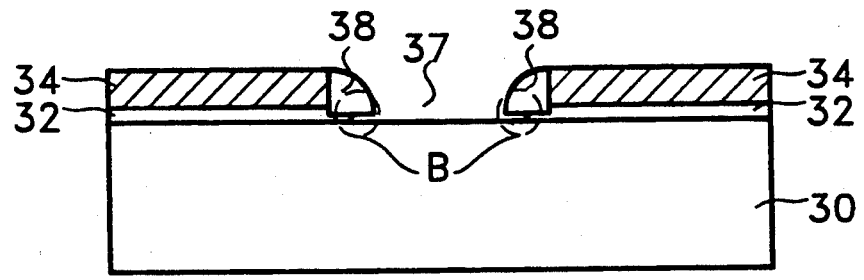

With reference now to FIG. 9, the portion of the pad oxide layer 32 which is exposed by the opening 37 is wet-etched in such a manner as to undercut the lower periphery of the spacers 38, to thereby form a cavity (B) beneath the spacers 38. Preferably, the exposed portion of the pad oxide layer 32 is anisotropically wet-etched using an oxide layer etchant such as HF (hydrofluoric acid), with the spacers 38 serving as the etch mask. The length of each cavity (B) is determined by the etching time, and the thickness of the pad oxide layer 32 remaining under the spacers 38 determines the amount of oxidizable material filling this area in the next step, and has a close relation with the length of the bird's beak which will be formed along the sides of the field oxide layer. In other words, if the length of the cavities (B) is too short, since all of the oxidizing agent is combined with the oxidizable material filling the cavities (B) (e.g., amorphous silicon) during the oxidation step for forming the field oxide layer, so that no material is left to react, then oxygen will infiltrate into the sides of the pad oxide layer 32 to combine with the silicon of the substrate 30 and result in the formation of a bird's beak. Thus, the length of the cavities (B) should be appropriately set, and in the embodiment of the present invention, it is preferably set to about 0.01-0.2 μm.

Figure 10:
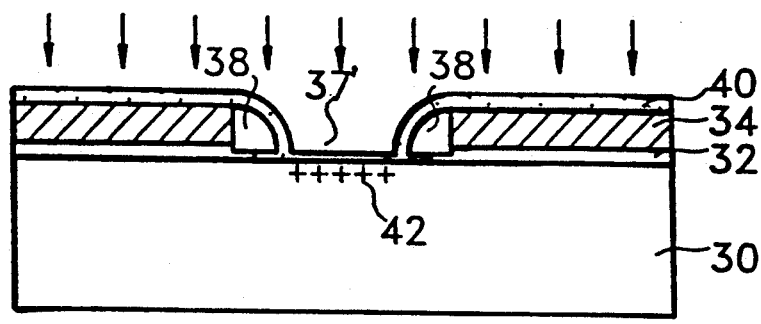

With reference now to FIG. 10, oxidizable material which will serve as the buffer layer 40 during the oxidation step, is formed on the overall surface of the resultant structure, to facilitate implantation of the channel-stop ions. Preferably, the oxidizable material is polysilicon or amorphous silicon. The buffer layer 40 is preferably formed by filling amorphous silicon in the opening 37 and in the undercut portion of the lower periphery of spacers 38. The amorphous silicon layer 40 is provided to combine with oxygen laterally entering the area under the spacers 38 so as to prevent formation of a bird's beak. This is different from the conventional LOCOS and SEPOX methods in which a bird's beak is created, since an oxidation medium (oxygen) infiltrates under the nitride layer (i.e., the second oxidation resistant layer) and is diffused laterally to oxidize the surface of the silicon substrate.

Subsequently, through opening 37' defined by spacers 38, impurity ions of the same conductivity type as that of the silicon substrate 30 are implanted to form channel-stop layer 42. It is important to recognize that the spacers 38 and the amorphous silicon layer 40 serve to narrow the window of implantation of the channel-stop ions.

Figure 11:
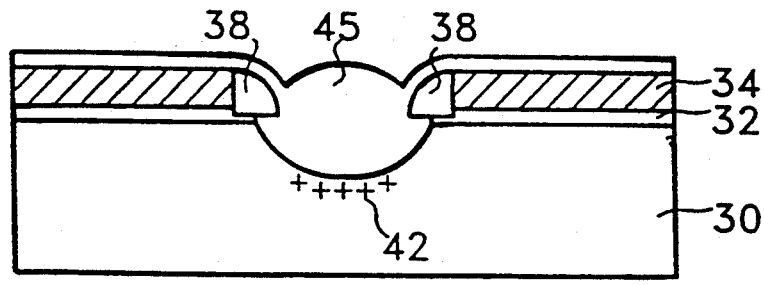

With reference now to FIG. 11, the semiconductor substrate 30 is wet oxidized at a high-temperature, e.g., about 900°-1,200° C., to form a field oxide layer 45 which serves as the device isolating region. As can be seen, the field oxide layer has a very short bird's beak. Further, since the amorphous silicon layer 40 functions as a buffer layer against oxidation during the oxidation step, the thickness of the field oxide layer 45 is thinner than that which can be achieved with the conventional LOCOS method. Generally, the thickness of the field oxide layer 45 is reduced by as much as about 0.1 μm (1,000 Å).

Figure 12:
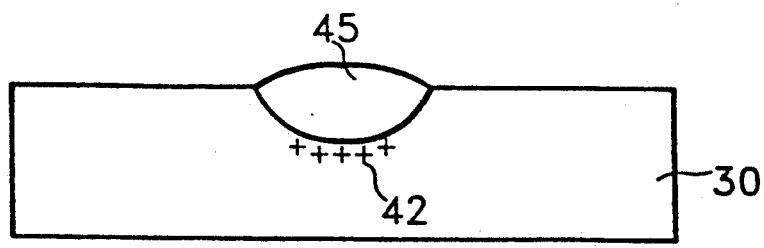

With reference now to FIG. 12, the remaining material layers (i.e., the masking portion 34 and the spacers 38) are removed to complete the formation of the device isolating region, i.e., only the field oxide layer 45 remains.

Figure 13:
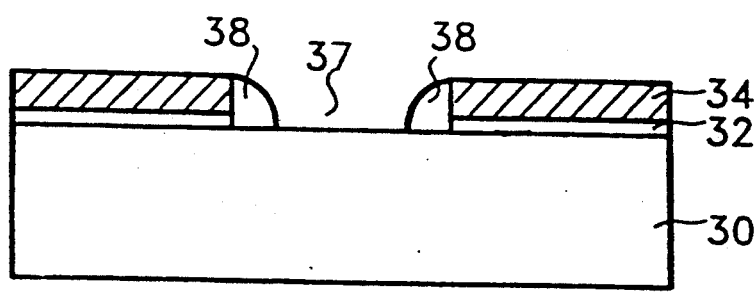
Figure 14:
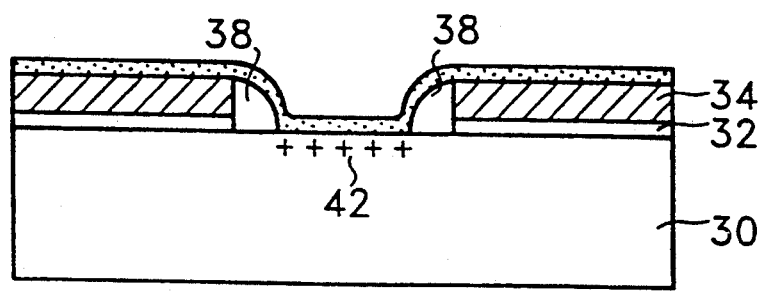
Figure 15:
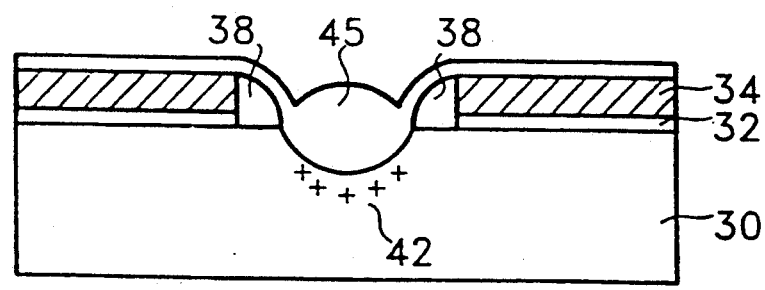

With reference now to FIGS. 13, 14 and 15, another embodiment of the device isolation process of the present invention will now be described.

More particularly, with reference now to FIG. 13, opening 37 and spacers 38 are formed on the portion to become the device isolating region of silicon substrate 30. Specifically, the first oxidation resistant layer 34 and the pad oxide layer 32 are both etched to define the opening 37. Since the lateral diffusion of oxygen between the first oxidation resistant layer 34 and the pad oxide layer 32 is blocked by spacers 38 serving as the oxidation resistant layer, the creation of the bird's beak can be effectively prevented during the subsequent oxidation step.

With reference now to FIG. 14, oxidizable material 40 is formed on the overall surface of the resultant structure of FIG. 13 and channel-stop ions are implanted to form channel-stop layer 42 in the portion of the substrate 30 to become the device isolating region.

With reference now to FIG. 15, the substrate 30 is oxidized at a high temperature. It is important to recognize that the lateral encroachment of the active region by the field oxide layer 45 is very limited so that the field oxide layer 45 has a very short bird's beak.

It can now be appreciated that in the above-described embodiments of the device isolation process of the present invention, a spacer is formed and the lower periphery of the spacer is undercut so as to implant a material combinable with an oxidation medium introduced under the spacer, for instance, amorphous silicon, or a spacer made of the oxidation resistant layer is provided to block the lateral diffusion of oxygen. Therefore, the three-dimensional oxidation phenomenon, that is, bird's beak, which has been a major problem to be solved with the conventional LOCOS or SEPOX techniques, can be minimized to thereby greatly reduce the dimensions of the device isolating region and to enable a much higher packing density of semiconductor devices.

Further, before the implantation of channel-stop ions, since the spacer and amorphous polysilicon layer are formed around the nitride layer and used as the mask for ion implantation, the ion implantation window is significantly reduced, and the distance of the lateral diffusion of the channel resistant ions is also greatly reduced, to thereby raise the breakdown voltage of the devices and prevent leakage current between devices, thereby enhancing the reliability of the overall semiconductor device.

In addition, since oxidizable material such as amorphous silicon is overlaid as the buffer layer on the overall surface of the substrate during the oxidation step and the resultant structure is oxidized at a high temperature, the resultant field oxide layer can be formed thinner than is possible with the presently available technology, to thereby improve step coverage.

Although two embodiments of the present invention have been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. A method for manufacturing a semiconductor device, comprising the steps of:
   forming a buffer layer on a semiconductor substrate having device active regions and a device isolating region disposed between said device active regions, said device active regions and said device isolating region being co-planar;
   forming a first oxidation resistant layer on said buffer layer;
   selectively removing a portion of said first oxidation resistant layer disposed above said device isolating region, with remaining portions of said first oxidation resistant layer being disposed above said device active regions, with opposed sidewalls of said first oxidation resistant layer defining an opening in said first oxidation resistant layer above said device isolating region, and with a portion of said buffer layer disposed above said device isolating region being exposed by said opening;
   forming a spacer made of oxidation-resistant material on each of said opposed sidewalls of said first oxidation resistant layer;
   isotopically etching said exposed portion of said buffer layer in such a manner as to etch away both said exposed portion of said buffer layer and a portion of said buffer layer disposed beneath a marginal edge portion of a bottom surface of each said spacer, to thereby form a cavity beneath each said spacer, wherein each said cavity extends beneath a corresponding one of said spacers in a lateral direction towards a vertical plane defined by a corresponding one of said opposed sidewalls of said first oxidation resistant layer, but not s far as said vertical plane;
   depositing an oxidizable material on the overall structure resulting from the preceding steps in such a manner as to fill said cavity beneath each said spacer with said oxidizable material, to thereby provide an oxidizable material layer; and,
   oxidizing said oxidizable material layer in such a manner as to form a field oxide layer in said device isolating region, and a peripheral oxide layer adjacent opposite sides of said device isolating region.

2. The method as set forth in claim 1, further comprising the step of removing each said spacer, said remaining portions of said first oxidation resistant layer, remaining portions of said buffer layer, and said peripheral oxide layer.

3. The method as set forth in claim 1, wherein said buffer layer is a pad oxide layer.

4. The method as set forth in claim 1, wherein said buffer layer is a composite layer comprised of a pad oxide layer and a polysilicon layer.

5. The method as set forth in claim 1, wherein said first oxidation resistant layer is a silicon nitride layer.

6. The method as set forth in claim 1, wherein said forming a spacer step is carried out by forming a second oxidation resistant layer on said remaining portions of said first oxidation resistant layer and said exposed portion of said buffer layer and then anisotropically etching said second oxidation resistant layer in such a manner as to form said spacers on said opposed sidewalls of said first oxidation resistant layer.

7. The method as set forth in claim 1, wherein said oxidizable material is made of a material selected from the group consisting of amorphous silicon and polysilicon.

8. The method as set forth in claim 1, further comprising, prior to execution of said oxidizing step, the step of implanting impurities through said opening in said first oxidation resistant layer into said device isolating region of said substrate, to thereby form a channel-stop layer in said device isolating region.

* * * * *